US010431514B2

(12) United States Patent
Bonnici et al.

(10) Patent No.: US 10,431,514 B2
(45) Date of Patent: Oct. 1, 2019

(54) SEMICONDUCTOR PACKAGES HAVING DUAL ENCAPSULATION MATERIAL (71) Applicant: STMICROELECTRONICS (MALTA) LTD, Kirkop (MT)

(72) Inventors: David Bonnici, Zurrieq (MT); Brenda Farrugia, Zurrieq (MT)

(73) Assignee: STMicroelectronics (Malta) Ltd, Kirkop (MT)

( * ) Notice: Subject to any disclaimer, the term of this patent is extended or adjusted under 35 U.S.C. 154(b) by 0 days.

(21) Appl. No.: 15/818,508

(22) Filed: Nov. 20, 2017

(65) Prior Publication Data

US 2019/0157176 A1 May 23, 2019

(51) Int. Cl.
*H01L 21/00* (2006.01)
*H01L 23/31* (2006.01)
*H01L 25/16* (2006.01)
*H01L 23/00* (2006.01)
*H01L 23/29* (2006.01)
*H01L 21/56* (2006.01)
*H01L 21/78* (2006.01)
*H01L 31/0203* (2014.01)
*H01L 31/02* (2006.01)
*H01L 27/146* (2006.01)
*H01L 33/56* (2010.01)
*H01L 33/62* (2010.01)

(52) U.S. Cl.
CPC ........ *H01L 23/3135* (2013.01); *H01L 21/561* (2013.01); *H01L 21/565* (2013.01); *H01L 21/78* (2013.01); *H01L 23/296* (2013.01); *H01L 23/3121* (2013.01); *H01L 24/48* (2013.01); *H01L 25/165* (2013.01); *H01L 25/167* (2013.01); *H01L 27/1469* (2013.01); *H01L 27/14618* (2013.01); *H01L 27/14634* (2013.01); *H01L 27/14636* (2013.01); *H01L 31/0203* (2013.01); *H01L 31/02005* (2013.01); *H01L 33/56* (2013.01); *H01L 33/62* (2013.01); *H01L 2224/48091* (2013.01); *H01L 2224/48106* (2013.01); *H01L 2224/48227* (2013.01); *H01L 2924/1204* (2013.01); *H01L 2933/005* (2013.01)

(58) Field of Classification Search
None
See application file for complete search history.

(56) References Cited

U.S. PATENT DOCUMENTS

| | | | |
|---|---|---|---|
| 6,271,102 B1 * | 8/2001 | Brouillette | B23D 59/002 257/E21.518 |
| 6,509,636 B1 * | 1/2003 | Tsai | H01L 23/10 257/678 |
| 2009/0004778 A1 * | 1/2009 | Lee | B29C 45/14655 438/113 |
| 2017/0141241 A1 * | 5/2017 | Yu | G01J 1/0209 |

* cited by examiner

*Primary Examiner* — Reema Patel
(74) *Attorney, Agent, or Firm* — Seed Intellectual Property Law Group LLP (57) ABSTRACT

One or more embodiments are directed to a semiconductor package that includes transparent encapsulation material and an opaque encapsulation material. In one embodiment, the opaque encapsulation material is thicker than the transparent encapsulation material; however, the outer surfaces of the opaque and the transparent encapsulation materials are coplanar with each other.

18 Claims, 6 Drawing Sheets

SEMICONDUCTOR PACKAGES HAVING DUAL ENCAPSULATION MATERIAL

BACKGROUND

Technical Field

Embodiments of the present disclosure are related to semiconductor packages and methods of forming same.

Description of the Related Art

Ongoing demand for smaller and better electronic devices pressures manufacturers of such devices to increase component density, as well as reduce component size, wherever possible within the device. Semiconductor fabricators have responded by increasing the use of chip scale packaging and wafer level packaging techniques to minimize the footprint of the semiconductor package. As the size of semiconductor packages are reduced, the packages must be manufactured within tighter tolerances.

The demand for smaller packages can also cause difficulties in the assembly process, particularly with semiconductor packages that include optical sensors. Packages that include optical sensors have transparent molding, which is typically soft and fragile. This can make the package itself weaker and susceptible to damage. Some packages that have optical sensors are assembled by first forming outer package walls on a substrate and then attaching and electrically coupling a semiconductor die to the substrate, thereby demanding suitable space between an edge of the die and a surface of an adjacent wall. Further, dedicated molds are required for forming the outer package walls.

BRIEF SUMMARY

One or more embodiments are directed to a semiconductor package that includes both a transparent encapsulation material and an opaque encapsulation material. In at least one embodiment, the opaque encapsulation material is thicker than the transparent encapsulation material; however, the outer surfaces of the opaque and the transparent encapsulation materials are coplanar with each other. In particular, a semiconductor package includes a substrate having a center portion and a perimeter portion that is around the center portion. The perimeter portion of the substrate has a thickness that is less than the center portion. A semiconductor die including an optical component is mounted to the substrate at the center portion. The transparent encapsulation material encapsulates the die and is located over the center portion of the substrate. The opaque encapsulation material is at a perimeter portion of the substrate and forms a perimeter of the package. Due to the thinner perimeter portion of the substrate, the opaque encapsulation material has a thickness that is greater than the thickness of the transparent encapsulation material.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

One or more embodiments are directed to a semiconductor package that includes both a transparent encapsulation material and an opaque encapsulation material. In at least one embodiment, the opaque encapsulation material is thicker than the transparent encapsulation material; however, the outer surfaces of the opaque and the transparent encapsulation materials are coplanar with each other. In particular, a semiconductor package includes a substrate having a center portion and a perimeter portion that is around the center portion. The perimeter portion of the substrate has a thickness that is less than the center portion. A semiconductor die including an optical component is mounted to the substrate at the center portion. The transparent encapsulation material encapsulates the die and is located over the center portion of the substrate. The opaque encapsulation material is at a perimeter portion of the substrate and forms a perimeter of the package. Due to the thinner perimeter portion of the substrate, the opaque encapsulation material has a thickness that is greater than the thickness of the transparent encapsulation material.

It will be appreciated that, although specific embodiments of the present disclosure are described herein for purposes of illustration, various modifications may be made without departing from the spirit and scope of the present disclosure.

In the following description, certain specific details are set forth in order to provide a thorough understanding of various aspects of the disclosed subject matter. However, the disclosed subject matter may be practiced without these specific details. In some instances, well-known structures of semiconductor die and methods of fabricating semiconductor wafers that includes dice are not described in detail to avoid obscuring the descriptions of other aspects of the present disclosure.

Figure 1A:
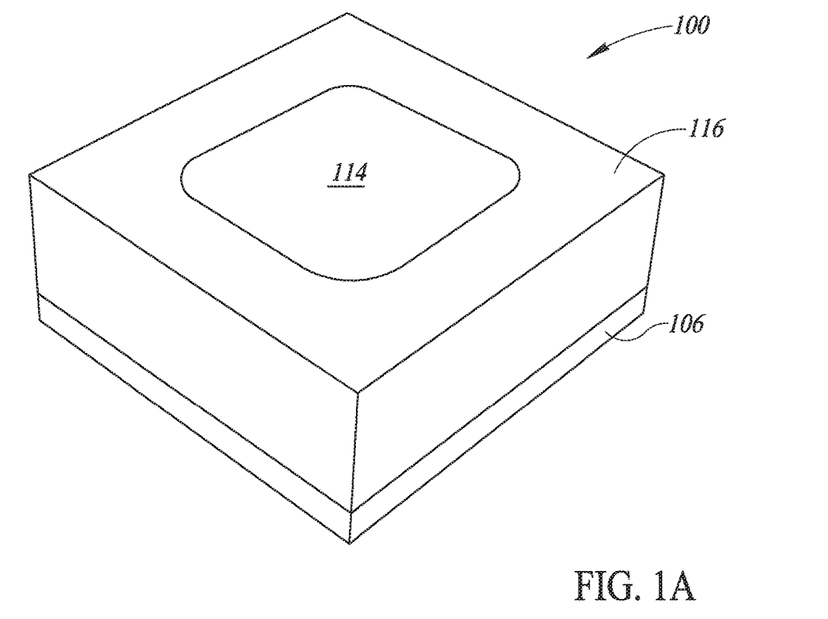
FIGS. 1A-1D are various views of a schematic illustration of a semiconductor package in accordance with one embodiment.
Figure 1B:
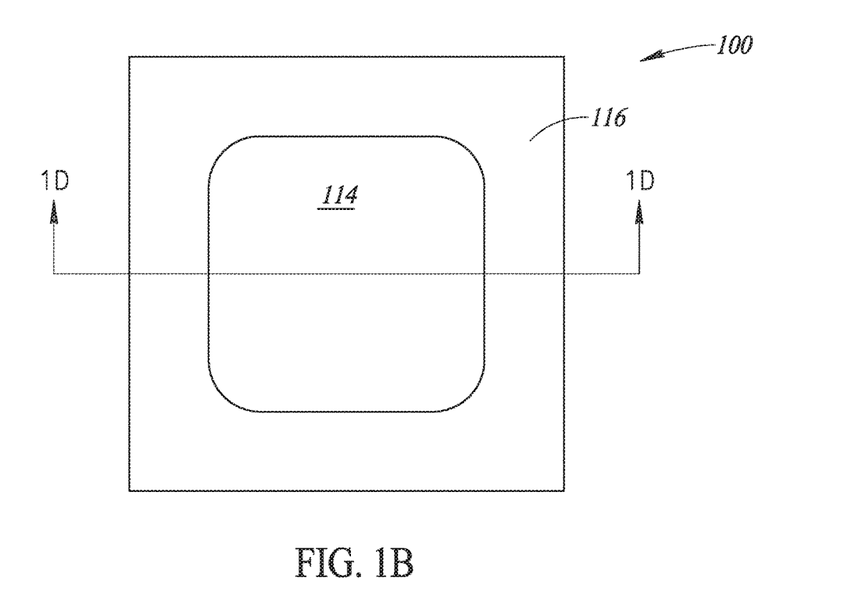
Figure 1C:
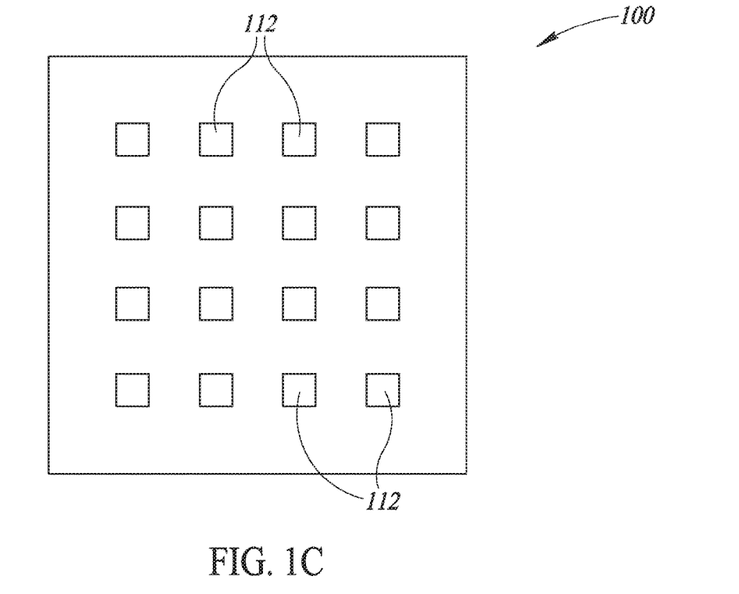
Figure 1D:
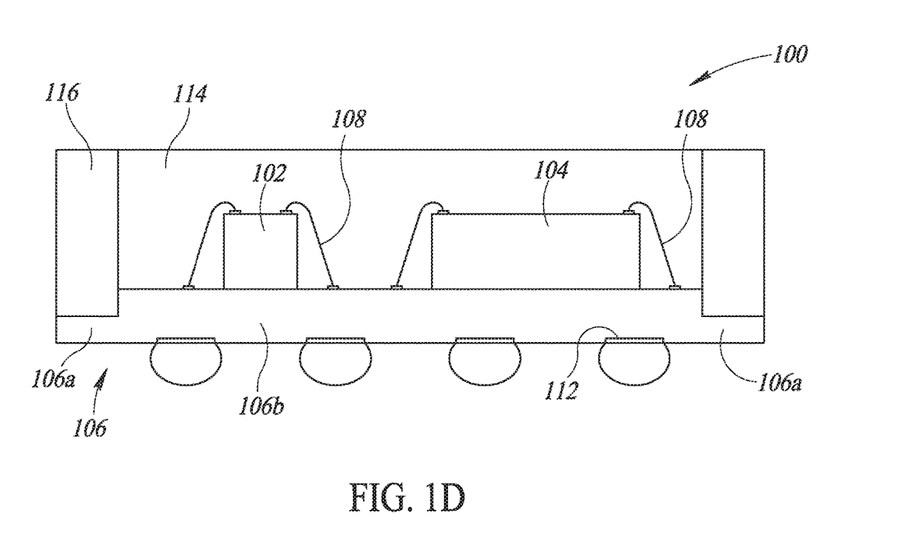

FIG. 1A is a top isometric view of a semiconductor package 100 in accordance with one embodiment. FIGS. 1B and 1C are a top plan view and a bottom plan view, respectively, of the package 100 of FIG. 1A. FIG. 1D is cross-sectional view of the package 100 as shown by line D-D in FIG. 1B.

As best shown in FIG. 1D, the semiconductor package 100 includes a first die 102 of semiconductor material and a second die 104 of semiconductor material mounted to a first surface of a substrate 106, such as by adhesive material (not shown). The first and second dice 102, 104 include active surfaces integrating one or more electrical components, such as integrated circuits, as is well known in the art. In at least one embodiment, the active surface of first die 102 includes an optical component, such as an image sensor, and the active surface of the second die 104 may include one or more of an optical component, an application specific integrated circuit (ASIC), or a microelectromechanical sensor (MEMS).

The first and second dice 102, 104 are electrically coupled to the substrate 106 by conductive wires 108. In particular, first ends of conductive wires 108 are coupled to bond pads of an active surface of the first die 102, and second ends of the conductive wires 108 are coupled to conductive elements on the first surface of the substrate 106. Similarly, first ends of conductive wires 108 are coupled to bond pads of an active surface of the second die 104, and second ends of the conductive wires 108 are coupled to conductive elements on first surface of the substrate 106.

Although not shown, either or both of the first die 102 and the second die 104 may be coupled to the substrate 106 by flip chip arrangement. That is, the active surfaces of the first and second dice 102, 104 are facing the first surface of the substrate, and conductive bumps are between the bond pads of the active surface of the first and second dice 102, 104 and the conductive contacts of the substrate 106, as is well known in the art.

Although not shown, the substrate 106 includes conductive traces and vias between various layers of insulative material, as is well known in the art. The substrate may be a printed circuit board (PCB). A second surface of the substrate 106 that is outside of the package 100 includes output pads or lands 112, as best shown in FIG. 1C. The lands are electrically coupled to components of one or more of the first and second dice 102, 104. In particular, although not shown, the conductive elements at the first surface of the substrate 106 are coupled to the pads of the lands by electrical vias and traces formed in the substrate, as is well known in the art. The lands 112 provide electrical communication between devices and package 100. In FIG. 1D, the lands 112 include conductive balls, such as solder balls, that are used for coupling the package 100 to another substrate, board, such as a PCB, or another device.

The substrate 106 includes a perimeter portion 106a surrounding a center portion 106b. The perimeter portion 106a of the substrate 106 is thinner than the center portion 106b of the substrate 106, as best shown in FIG. 1D. The perimeter portion 106a extends around the entire center portion 106b.

Over the center portion 106b of the substrate 106 and surrounding at least the first die 102 and the conductive wires 108 coupled to the first die 102 is a transparent encapsulation material 114. The transparent encapsulation material 114 is suitable for light to be transmitted therethrough to allow light to be received and/or transmitted between the optical component of the first die 102 and an environment external to the semiconductor package 100. In particular, the active surface of the first die 102 is facing the transparent encapsulation material 114 so that the optical component of the first die 102 can receive and/or transmit light through the transparent encapsulation material 114.

The transparent encapsulation material 114 protects the electrical components therein, such as the first and second dice 102, 104 and conductive wires 108 or bumps, from external environmental sources of damage, such as corrosion, physical damage, moisture damage, or other causes of damage to electrical components. In at least one embodiment, the transparent encapsulation material 114 is a transparent silicone, such as a platinum catalyst mixed with a base material. In another embodiment, the transparent encapsulation material 114 is a transparent epoxy.

Around the transparent encapsulation material 114 and over the perimeter portion 106a of the substrate 106 is an opaque encapsulation material 116, such as an electronic molding compound (EMC). In one embodiment, the opaque encapsulation material includes a resin and a filler. The opaque encapsulation material 116 prevents visible light from being provided from a side surface of the semiconductor package 100 to the optical component of the first die 102 (or second die 104). Thus, light is only received into the semiconductor package 100 through the transparent encapsulation material 114. Similarly, light is only transmitted from the semiconductor package through the transparent encapsulation material 114.

The opaque encapsulation material 116 is harder than the transparent encapsulation material 114, and protects the transparent encapsulation material 114 from physical damage, thereby further protecting the electrical components within the transparent encapsulation material 114.

For instance, the transparent encapsulation material 114 may be softer or more elastic than the opaque encapsulation material 116. Thus, by providing a harder material at the perimeter of the package by the opaque encapsulation material 116, the package 100 is easier to handle and less susceptible to damage during handling. In particular, the transparent encapsulation material 114, as well as the electrical components therein, may be protected from further damage. Thus, the integrity of the package 100 and transparent encapsulation material 114 are protected.

As mentioned above, the transparent encapsulation material 114 is located over the center portion 106b of the substrate 106, which has a greater thickness than the perimeter portion 106a of the substrate 106, while the opaque encapsulation material 116 is located over the perimeter portion 106a of the substrate 106. Outer surfaces of the transparent encapsulation material 114 and opaque encapsulation material 116, however, are coplanar with each other. In that regard, the transparent encapsulation material 114 has a thickness that is less than a thickness of opaque encapsulation material 116 as best shown in FIG. 1D.

In the illustrated embodiment, the second die 104 and corresponding conductive wires 108 are also located in the transparent encapsulation material 114, but in other embodiments, the second die 104 may be located on the perimeter portion 106a of the substrate 106 and embedded in the opaque encapsulation material 116.

FIGS. 2A-2D illustrate cross-sectional views of various stages of an assembly process for forming a plurality of semiconductor packages, such as the semiconductor package 100 of FIG. 1, in accordance with an embodiment of the present disclosure. The assembly process involves making the semiconductor packages 100 at a substrate wafer level. Although only a portion of a substrate wafer 106c is shown, on which two semiconductor packages 100 are shown as being formed, it is to be appreciated that the substrate wafer 100 includes more semiconductor packages 100 being formed.

Figure 2A:
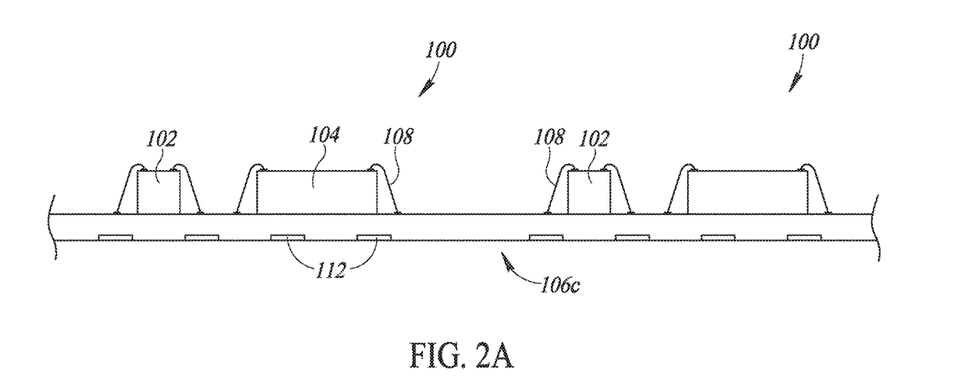
FIGS. 2A-2D are schematic illustrations of various stages of an assembly process for forming a package in accordance with one embodiment.

As shown in FIG. 2A the first and second dice 102, 104 are mounted on a first surface of the substrate wafer 106c for each semiconductor package 100 to be formed. For instance, each of the first and second dice 102, 104 may be coupled to the first surface of the substrate 106 by an adhesive material, such as double-sided tape, a paste, glue, etc. The first and second dice 102, 104 are electrically coupled to the substrate 106, such as by conductive wires 108 or by conductive bumps, as is well known in the art.

Figure 2B:
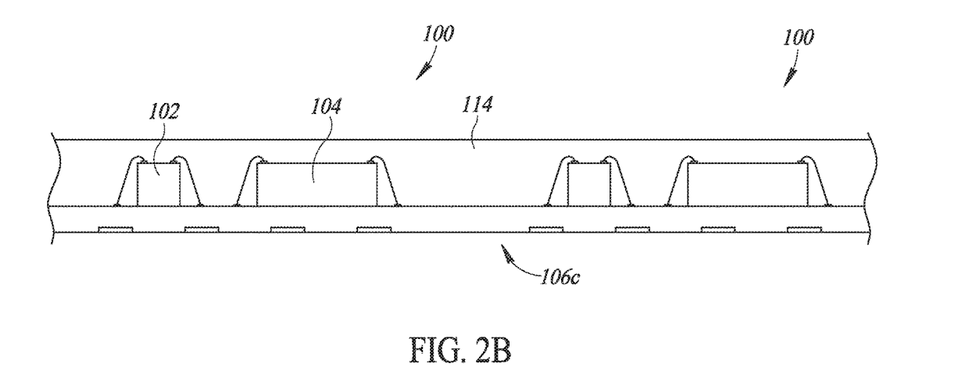

In a first molding step, a transparent encapsulation material 114 is formed on the substrate 106 to encapsulate the first and second dice 102, 104 and the conductive wires 108. In one embodiment, the first molding step involves placing the substrate wafer 106c or a portion of the substrate wafer 106c in a cavity of a mold and closing the mold. The transparent encapsulation material 114 in a flowable form is introduced into the mold and fills the cavity. The cavity may be placed under vacuum, and pressure may be applied to the mold to aid in removing air from the cavity to encourage the transparent encapsulation material 114 to flow throughout the cavity.

The transparent encapsulation material 114 hardens over time, which may involve one or more curing steps. The substrate wafer 106c is then removed from the mold. The inner surfaces of the mold may include a release material to aid in removing the substrate wafer 106c from the mold after the transparent encapsulation material 114 has hardened.

Figure 2C:
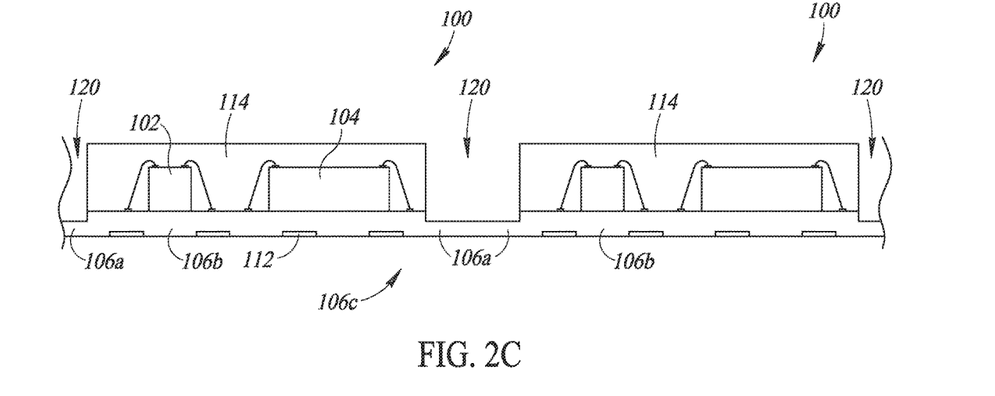

As best shown in FIG. 2C, portions of the transparent encapsulation material 114 are removed to form channels 120 in the transparent encapsulation material 114. In particular, the transparent encapsulation material 114 is removed at a perimeter of each package 100 to be formed so that the channels 120 surround each package 100. Each channel 120 includes perimeter portions of adjacent packages 100 on the substrate wafer 106c and a dicing street for separating the packages 100 at a later dicing separation step.

The channels 120 are formed by cutting the transparent encapsulation material 114 in a dicing step, such as by a saw blade or laser cutting. In one embodiment, a saw blade is used that has a thickness that corresponds to the width of the channels 120 to be formed. As referenced above, the channels 120 have a suitable thickness to include perimeter portions of adjacent packages 100 as well as dicing streets between the adjacent packages 100.

To ensure that all of the transparent encapsulation material 114 has been removed, portions of the substrate wafer 106c are also removed below the transparent encapsulation material 114. In one embodiment, the portions of the substrate wafer 106c are removed in the same step as the transparent encapsulation material 114 is removed. Alternatively, the portions of the substrate wafer 106c can removed in a subsequent step. The portions removed from the substrate wafer 106c at the channels 120 form the perimeter portions 106a, while the portions of the substrate wafer 106c that are not removed form the center portions 106b. Thus, the center portions 106b of the substrate wafer 106c are thicker than the perimeter portions 106a.

Although not shown, it is to be appreciated that the dicing step occurs around an entire perimeter of each of the packages 100 so that the transparent encapsulation material 114 is removed around an entire perimeter portion 106a of each of the packages 100. Thus, in one embodiment dicing occurs in the transparent encapsulation material 114 across the entire substrate wafer 106c in one direction, such as into the page as shown in FIG. 2C. Then, the transparent encapsulation material 114 and substrate wafer 106c are cut in a perpendicular direction.

Figure 2D:
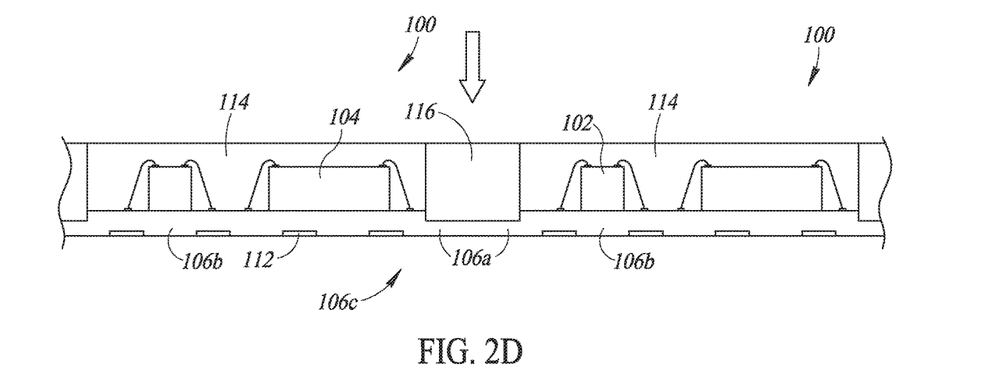

With reference to FIG. 2D, in a second molding step, the opaque encapsulation material 116 is formed in the channels 120 of the transparent encapsulation material 114 and substrate wafer 106c. As mentioned above, the channels 120 include perimeter portions 106a of adjacent packages 100 on the substrate wafer 106c and the dicing street between the adjacent packages 100. The opaque encapsulation material 116 fills the channels 120 completely. The second molding step may include similar steps as described above in reference to the first molding step for forming the transparent encapsulation material 114, but the opaque encapsulation material 116 is introduced into the mold, rather than the transparent encapsulation material.

Upon hardening, the opaque encapsulation material 116 adheres to the transparent encapsulation material 114 and the perimeter portions 106a of the substrate wafer 106c. An outer surface of the opaque encapsulation material 116 is flush or coplanar with an outer surface of the transparent encapsulation material 114, as shown in FIG. 2D.

After the opaque encapsulation material 116 is formed, the plurality of semiconductor packages 100 may be separated from each other by dicing along dicing streets as indicated by the arrow in FIG. 2D. In particular, the dicing streets extend throughout the perimeter portions 106a of the substrate wafer 106c and the opaque encapsulation material 116. The dicing step may include any suitable dicing procedures for separating packages, such as laser, saw, scribing etc.

Figure 3:
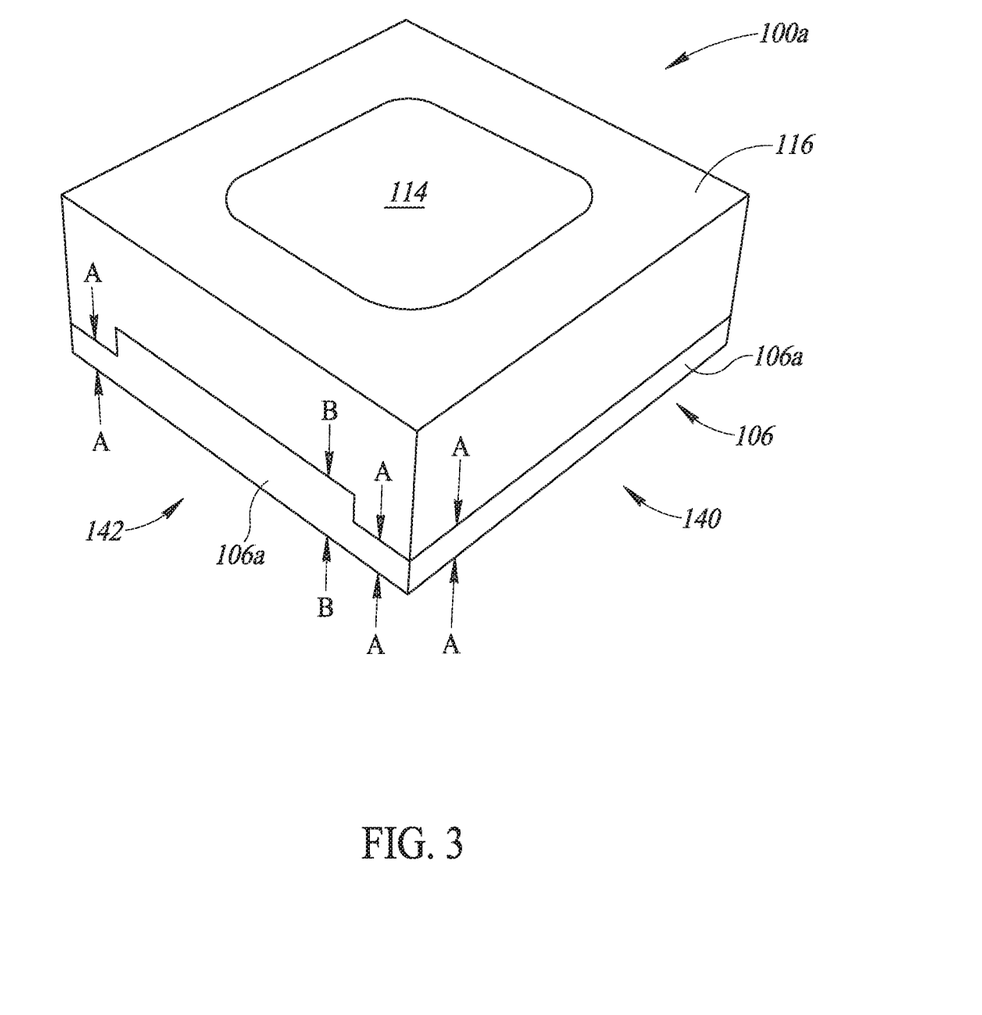
FIG. 3 is an isometric view of a semiconductor package in accordance with another embodiment.

FIG. 3 shows a schematic illustration of an isometric view of a semiconductor package 100a in accordance with another embodiment. The semiconductor package 100a of FIG. 3 includes components that are identical in structure and function as the semiconductor package 100 of FIGS. 1A-1D except for the differences that will be discussed below. As shown in FIG. 3, a first side 140 of the substrate 106 has a first thickness that is different from a second side 142 of the substrate 106 that is adjacent to the first side 140. Although not shown, the opposing sides of the substrate 106 have similar thicknesses as each other, respectively. That is, the opposing side of the first side 140 has a constant thickness and the opposing side of the second side 142 has a similar varying thickness.

The first side 140 of the substrate 106 has a first thickness as indicated by arrows A that extends an entire length of the first side 140, while the second side 142 has first and second thicknesses as indicated by arrows A-A and B-B. In particular, the second side 142 has ends having the same thickness as the first side 140 as indicated by arrows A-A, and an inner portion that is thicker as indicated by arrows B-B. The thicker inner portion of the second side is still thinner than the center portion of the substrate. The different thicknesses in the substrate are formed during the cutting process for forming the channels 120 in the transparent encapsulation material 114 and the substrate, as described in reference to FIG. 2C. In one embodiment, the substrate wafer is cut in the dicing step using a saw blade at a first height in a first direction to form the thickness as indicated by arrows A-A. Then, once all of the cuts have been made throughout the substrate wafer in the first direction, the substrate wafer is cut in a perpendicular direction in the corresponding dicing streets to form the second thickness indicated by arrows B-B. The height of the saw blade is higher in the second direction.

Although not shown, the center portion of the substrate is thicker than the thickest portion in the perimeter portion of the substrate, which is the thickness indicated by arrows B-B.

The above described semiconductor packages allow for ease in assembly of smaller packages, such as packages sized around 2 millimeters (mm) by 2 mm. In particular, the semiconductor dice may be electrically and mechanically coupled to a surface of the substrate without walls being formed around each corresponding package. Furthermore, by have the opaque encapsulation material around the outer surfaces of the packages, the integrity of the transparent encapsulation material is not compromised during handling of the packages. Further, the molding process allows for improved surface control. Further yet, the same mold can be used for packages of varying size.

The optical component may be any optical component configured to receive and/or send light. Light used herein may refer to any waves on the electromagnetic spectrum including visible light and infrared.

In some embodiments, only the first die, which includes the active surface having an optical component, is encapsulated in the transparent encapsulation material. Thus, the second die, which in these embodiments does not include an optical component, is encapsulated in the opaque encapsulation material. In that regard, the opaque encapsulation material may take up a larger surface area of the package than the transparent encapsulation material.

Figure 4:
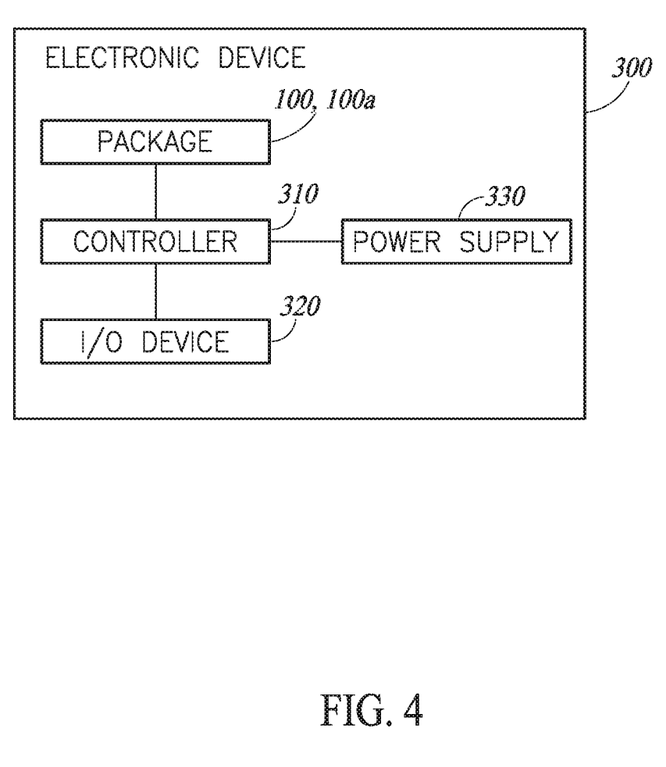
FIG. 4 is a block diagram of at least some of the electrical components of a device comprising a semiconductor package of FIGS. 1A-1D or FIG. 3.

FIG. 4 illustrates a block diagram of an electronic device that includes the semiconductor package 100 or the semiconductor package 100a. The electronic device may be a mobile communications apparatus, such as a mobile phone and a personal digital assistant, a laptop, a desktop computer, a camera or video device including a network video, a vehicle parking sensor, a wearable device, such as a smartwatch, or any other electronic device. The electronic device 300 includes a controller 310 and the package 100 (or the package 100a), which is electrically coupled to the controller. The controller 310 includes control circuitry, which may include one or more processors, memory, and discrete logic. The controller 310 is configured to transmit signal to and receive signals from the proximity sensor 200. The electronic device may further include an input/output device 320, for example, a keyboard or a display that is coupled to the controller 310. The electronic device 300 may further include a power supply 330, which may be a battery or components for coupling to an external power source.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor package comprising:
  a substrate having a center portion and a perimeter portion, the perimeter portion having a surface and first and second thicknesses exposed at the surface, wherein the first and second thicknesses are different from each other, at least one of the first and second thicknesses being less than a third thickness of the center portion;
  a first die of semiconductor material mounted to the substrate at the center portion;
  a transparent encapsulation material on the center portion of the substrate and around the first die; and
  an opaque encapsulation material on the perimeter portion of the substrate,
  wherein the surface of the perimeter portion is coplanar with an outer surface of the opaque encapsulation material.

2. The semiconductor package of claim 1, wherein an outer surface of the transparent encapsulation material is coplanar with the outer surface of the opaque encapsulation material.

3. The semiconductor package of claim 1, further comprising a second die of semiconductor material mounted to the substrate at the center portion.

4. The semiconductor package of claim 1, wherein the first die includes an optical component.

5. The semiconductor package of claim 1, wherein the opaque encapsulation material has one or more thicknesses that are greater than a thickness of the transparent encapsulation material.

6. The semiconductor package of claim 1, wherein the first die is electrically coupled to the substrate by conductive wires.

7. The semiconductor package of claim 1, wherein the transparent encapsulation material is silicone and the opaque encapsulation material is resin.

8. The semiconductor package of claim 1, wherein at least one of the first thickness or the second thickness of the perimeter portion has a thickness that is less than 75% of the third thickness of the center portion.

9. A semiconductor package comprising:
  a substrate having a center portion and a perimeter portion around the center portion, wherein the perimeter portion of the substrate has a side surface having a first portion with a first thickness and a second portion with a second thickness, the first and second thicknesses being less than a third thickness of the center portion;
  a first die of semiconductor material mounted to the substrate at the center portion, the first die including an optical component;
  conductive elements electrically coupling the first die to electrical components of the substrate;
  a transparent encapsulation material on the center portion of the substrate and around the first die; and
  an opaque encapsulation material on the perimeter portion of the substrate and having a different thickness at the first portion than at the second portion, the opaque encapsulation material having an outer surface that is coplanar with an outer surface of the transparent encapsulation material, wherein the opaque encapsulation and the side surface of the perimeter portion of the substrate form a coplanar outer side surface of the semiconductor package.

10. The semiconductor package of claim 9, wherein at least one of the first or second thicknesses of the perimeter portion has a thickness that is between 25% and 75% the third thickness of the center portion.

11. The semiconductor package of claim 8, wherein the transparent encapsulation material is silicone.

12. The semiconductor package of claim 8, further comprising a second die mounted to the substrate at the center portion.

13. An electronic device comprising:
  a controller; and
  a semiconductor package coupled to the controller, the semiconductor package including:
    a substrate having a first portion having a first thickness and a second portion having a second thickness, the first and second portions having first and second surfaces, respectively, at a perimeter of the substrate, wherein the first thickness is greater than the second thickness, wherein both the first and second surfaces are exposed on at least one side of the semiconductor package;
    a first die of semiconductor material coupled to the substrate at a central portion;

a transparent encapsulation material encapsulating the first die and abutting the central portion of the substrate; and an opaque encapsulation material over the first and second portions of the substrate and along side surfaces of the transparent encapsulation material, the opaque encapsulation material being thinner over the first portion of the substrate than over the second portion of the substrate, the opaque encapsulation material being thicker than the transparent encapsulation material, wherein a surface of the opaque encapsulation material is coplanar with the first and second surfaces on the at least one side of the semiconductor package.

14. The electronic device of claim 13, wherein the central portion of the substrate has a third thickness that is less than 50% thicker than the first thickness of the first portion of the substrate.

15. The electronic device of claim 13, wherein the first and second portions together surround the central portion.

16. The electronic device of claim 13, wherein the first and second portions of the substrate are exposed on two first opposing sides of the semiconductor package.

17. The electronic device of claim 16, wherein the second portion of the substrate is exposed on two second opposing sides of the semiconductor package.

18. The electronic device of claim 13, wherein a surface of the transparent encapsulation material and a surface of the opaque encapsulation material are coplanar with each other.

* * * * *